US008772825B2

(12) United States Patent
Sheu et al.

(10) Patent No.: US 8,772,825 B2
(45) Date of Patent: Jul. 8, 2014

(54) STACKED SEMICONDUCTOR DEVICE AND A METHOD OF MANUFACTURING THE SAME

(75) Inventors: Jinn Kong Sheu, Tainan (TW); Wei-Chih Lai, Tainan (TW)

(73) Assignee: Phostek, Inc., Hsinchu (TW)

( * ) Notice: Subject to any disclaimer, the term of this patent is extended or adjusted under 35 U.S.C. 154(b) by 140 days.

(21) Appl. No.: 13/618,479

(22) Filed: Sep. 14, 2012

(65) Prior Publication Data

US 2014/0008613 A1     Jan. 9, 2014

(30) Foreign Application Priority Data

Jul. 4, 2012   (TW) .............................. 101124131 A

(51) Int. Cl.
*H01L 33/08*    (2010.01)
*H01L 33/16*    (2010.01)
*H01L 33/22*    (2010.01)

(52) U.S. Cl.
USPC 257/103; 257/88; 257/E33.003; 257/E33.012; 438/44

(58) Field of Classification Search
CPC ....... H01L 33/025; H01L 33/04; H01L 33/06; H01L 33/08; H01L 33/16; H01L 33/18; H01L 33/22
USPC ............... 257/13–22, 79–103, 613, 615, 627, 257/628, 631, E33.003, E33.005, E33.006, 257/E33.012; 438/22–47
See application file for complete search history.

(56) References Cited

U.S. PATENT DOCUMENTS

| 6,878,975 | B2* | 4/2005 | Hueschen .................... 257/104 |
| 7,446,345 | B2* | 11/2008 | Emerson et al. ............... 257/95 |
| 7,737,451 | B2* | 6/2010 | Ibbetson et al. ............... 257/81 |
| 8,124,957 | B2* | 2/2012 | Ibbetson et al. ............... 257/12 |
| 8,592,800 | B2* | 11/2013 | Moustakas et al. ............ 257/13 |
| 2008/0078439 | A1* | 4/2008 | Grundmann et al. ......... 136/249 |
| 2010/0006873 | A1* | 1/2010 | Raring et al. .................. 257/90 |
| 2013/0228791 | A1* | 9/2013 | Cheon et al. ................... 257/76 |

FOREIGN PATENT DOCUMENTS

TW           541711          7/2003

OTHER PUBLICATIONS

P Vennégués. "Defect Reduction Methods for III-Nitride Heteroepitaxial Films Grown Along Nonpolar and Semipolar Orientations." Semiconductor Science and Technology, IOP Publishing. Semicond. Sci. Technol. 27 (2012) 024004 (9pp). Downloaded from IOPscience on Sep. 25, 2012. http://iopscience.iop.org/0268-1242/27/2/024004.

Leung, Benjamin et al. "Using the Kinetic Wulff Plot to Design and Control Nonpolar and Semipolar GaN Heteroepitaxy." Semiconductor Science and Technology, Smicond. Sci. Technol. 27 (2012) 024005 (12pp). Downloaded from IOPscience on Sep. 25, 2012 http://iopscience.iop.org/0268-1242/27/2/024005.

* cited by examiner

*Primary Examiner* — Mark Tornow
*Assistant Examiner* — Eric Ward
(74) *Attorney, Agent, or Firm* — Huffman Law Group, PC

(57) ABSTRACT

A stacked semiconductor device and an associated manufacturing method are disclosed. A first semiconductor unit having a first surface, which is defined as being not a polar plane, is provided. At least one pit is formed on the first surface, and the pit has a second surface that lies at an angle relative to the first surface. A polarization enhanced tunnel junction is formed on the second surface, and a second semiconductor unit is formed above the tunnel junction.

27 Claims, 5 Drawing Sheets

STACKED SEMICONDUCTOR DEVICE AND A METHOD OF MANUFACTURING THE SAME

BACKGROUND OF THE INVENTION

1. Field of the Invention

The present invention generally relates to a semiconductor device, and more particularly to a stacked semiconductor device having a polarization enhanced tunnel junction formed on a non-polar semiconductor unit and a further semiconductor unit formed above the polarization enhanced tunnel junction.

2. Description of Related Art

One of the methods for increasing emission efficiency of a light-emitting diode (LED) is using tunnel junctions to stack up two or more LEDs. The stacked LEDs emit more light than a single LED, and thus exhibit increased brightness. The tunnel junction may also enhance current spreading such that more carriers are available in an active layer for recombination. Furthermore, stacked LEDs have fewer electrode contacts than individual LEDs in total, therefore saving more area and decreasing electromigration.

A conventional blue-green LED is primarily made of gallium nitride (GaN), which has a hexagonal structure, and the LED thus possesses polarization. The gallium nitride in commercialized blue-green LEDs is commonly grown on a C-plane sapphire substrate. Atomic charges along the flowing direction of carriers according to the aforementioned structure and growth, however, are asymmetrical, and hence generate a built-in electric field. The built-in electric field is mainly caused by the following two factors: (1) the charge of group III elements is different from the charge of group V elements; (2) the piezoelectric field caused by lattice mismatch between GaN material and the substrate (commonly known as quantum confine Stark effect (QCSE)). The QCSE causes quantum well bandgap skew, and thus reduces the probability of overlap between electron and hole wave functions, therefore reducing emission efficiency.

A need has thus arisen to propose a novel semiconductor device with an improved tunnel junction and without a built-in electric field to increase efficiency of the semiconductor device.

SUMMARY OF THE INVENTION

In view of the foregoing, an embodiment of the present invention provides a semiconductor device and an associated manufacturing method for forming a polarization enhanced tunnel junction above a non-polar semiconductor unit. Carriers in the disclosed semiconductor device may therefore be effectively transferred according to the polarization enhanced tunnel junction.

According to one embodiment, a first semiconductor unit having a first surface that is not a polar plane is provided. At least one pit is formed on the first surface, the pit having a second surface that lies at an angle relative to the first surface. A polarization enhanced tunnel junction is formed on the second surface. A second semiconductor unit is formed above the tunnel junction.

DETAILED DESCRIPTION OF THE INVENTION

Figure 1A:
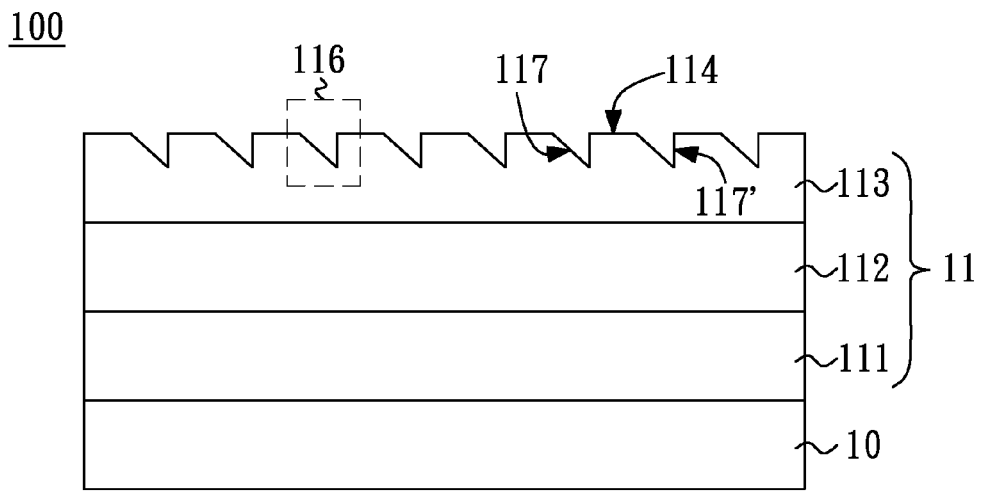
FIG. 1A to FIG. 1C show cross sections of a method of manufacturing a semiconductor device according to one embodiment of the present invention.
Figure 1B:
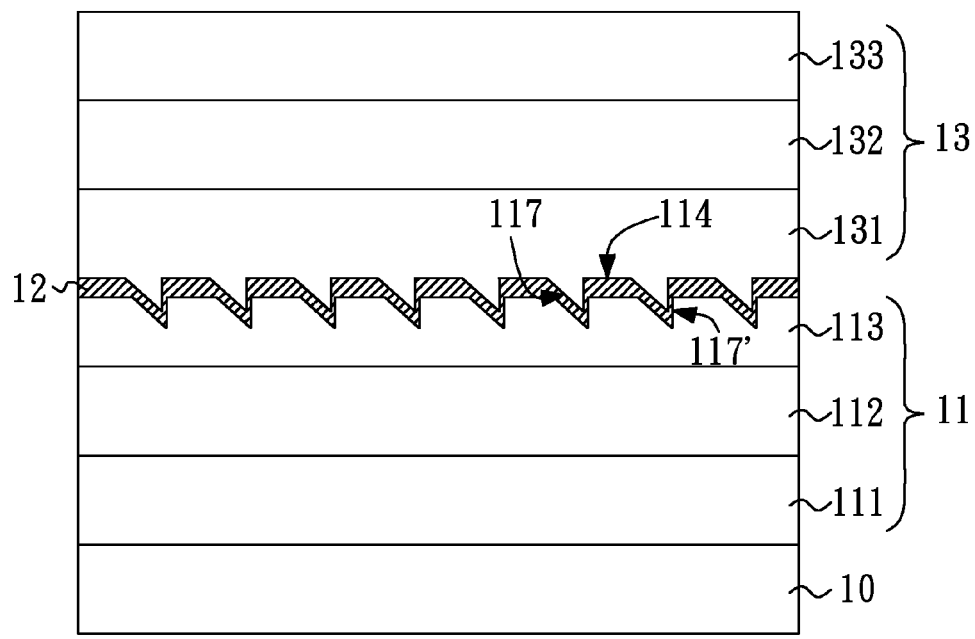
Figure 1C:
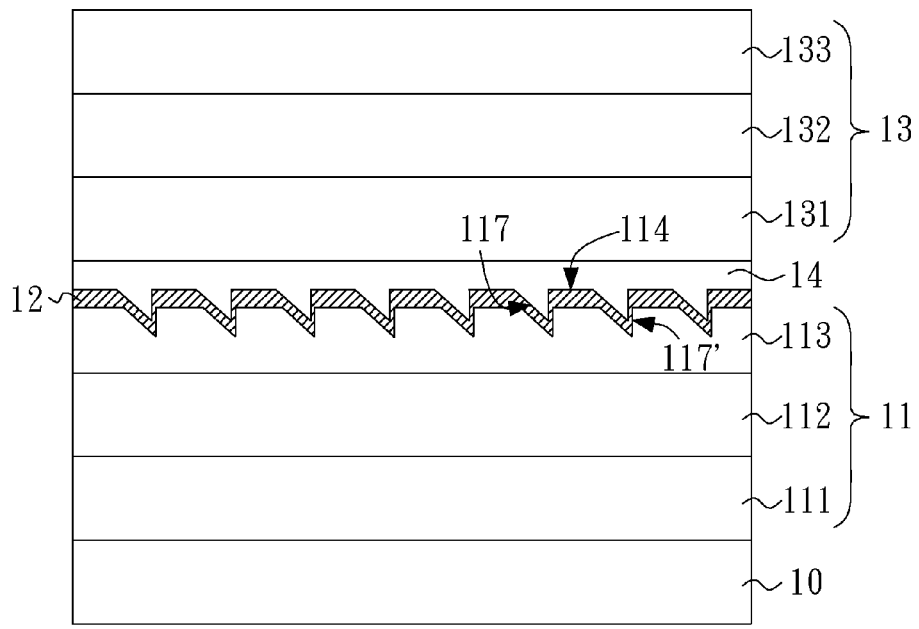

FIG. 1A to FIG. 1C show cross sections of a method of manufacturing a semiconductor device 100 according to one embodiment of the present invention. A light-emitting diode (LED) or a photovoltaic cell is exemplified and only elements pertinent to the embodiment are shown.

As shown in FIG. 1A, a non-polar or semi-polar first semiconductor unit 11 is first formed above a substrate 10. The first semiconductor unit 11 of the embodiment may, but not necessarily, be an LED or a photovoltaic cell. In the embodiment, the first semiconductor unit 11 includes a first doped layer 111, an active layer 112, and a second doped layer 113. The first doped layer 111 has conductivity opposite to conductivity of the second doped layer 113. For example, the first doped layer 111 is n-doped and the second doped layer 113 is p-doped, and the active layer 112 is interposed between the first doped layer 111 and the second doped layer 113. The substrate 10 may include a material of gallium arsenic (GaAs), germanium (Ge), silicon with silicon germanium (SiGe) formed thereon, silicon with silicon carbide (SiC) formed thereon, aluminum with aluminum oxide ($Al_2O_3$) formed thereon, gallium nitride (GaN), indium nitride (InN), aluminum nitride (AlN), sapphire, glass, quartz, or a combination thereof. The substrate 10 may include a polar substrate, a semi-polar substrate or a non-polar substrate. The first semiconductor unit 11 may, but not necessarily, include a material of group III nitride.

Figure 2:
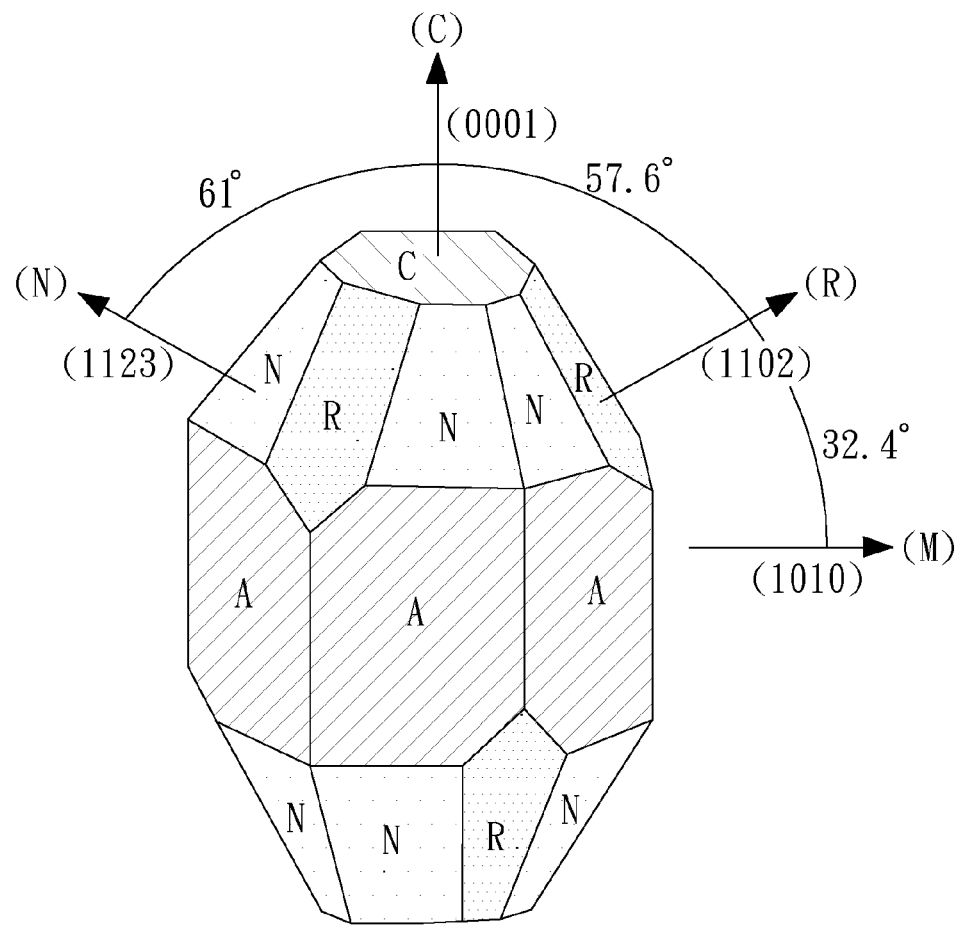
FIG. 2 schematically shows the relationship between the C plane, the M plane, the A plane, the R plane, and the N plane.

The first semiconductor unit 11 of the embodiment has a first surface 114, for example, a top surface of the second doped layer 113. The first doped layer 111, the active layer 112, and the second doped layer 113 are parallel to the first surface 114. The first surface 114 of the embodiment is not a polar plane, for example, not a C plane. In one embodiment, the first surface 114 is a non-polar plane, such as an M or A plane, or a semi-polar plane, such as an R or N plane. FIG. 2 schematically shows the relationship between the C plane, the M plane, the A plane, the R plane, and the N plane.

Figure 3A:
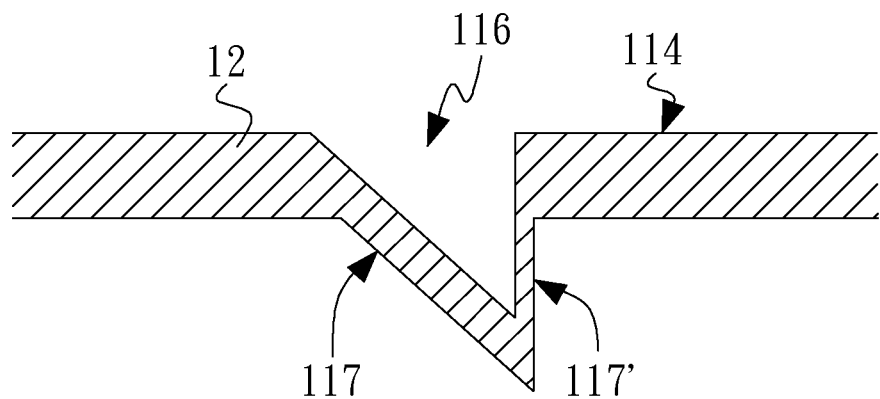
FIG. 3A and FIG. 3B show partial enlarged views of a pit in FIG. 1A.

In the embodiment, pits 116 are formed on the first surface 114 (e.g., the top surface of the second doped layer 113) as demonstrated in a partial enlarged view of FIG. 3A. The pit 116 has a second surface 117 and/or 117' that lies at an angle relative to the first surface 114, where the second surface 117' is perpendicular to the first surface 114. In the embodiment, the second surface 117 or 117' is a polar plane, such as a C plane, or is a semi-polar plane, such as an R or N plane. The carriers in the semiconductor device 100 may be effectively transferred with a properly chosen pair of the first surface 114 and the second surface 117/117'. For example, the first surface 114 is an M plane or A plane, the second surface 117 is an R plane, and the second surface 117' is a C plane. For another example, the first surface 114 is an R plane and the second surface 117 is a C plane.

Figure 3B:
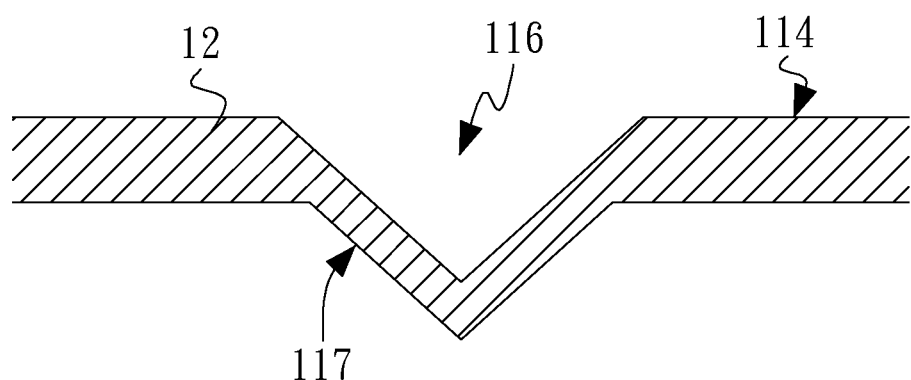

The pits 116 of the embodiment may be directly formed on the surface of the second doped layer 113 (as shown), or they may be indirectly formed above the second doped layer 113. The pits 116 may include a material (e.g., gallium nitride) that is the same as or different from the second doped layer 113. For example, the first semiconductor unit 11 may further include an epitaxial layer (not shown) that is formed above the second doped layer 113, and the pits 116 are then formed on a top surface (as being the first surface 114) of the epitaxial layer. In one embodiment, the pits 116 may be formed by properly controlling a process temperature and/or a growth rate. The pits 116 may be grown at the process temperature in a range of 500-900° C., preferably 800-900° C. The pits 116 may be grown at the growth rate in a range of 1-6 m/h, preferably 4-6 m/h. Alternatively, the pits 116 of group III nitride may be formed by increasing flow of precursors made of a nitride compound such as ammonia (NH3). The pits 116 may have a depth less than or equal to 2 m, and larger than 10 nm. Each pit 116 may have an aperture less than or equal to 2 m. As an angle between crystal axes is fixed, the depth and the aperture of each pit 116 usually have a specific ratio. In another embodiment, the pits 116 may be formed by photolithography and etching techniques. Although a half-V shaped pit 116 is exemplified in FIG. 3A, the pit 116 may adopt other cross-sectional shape such as a full-V shape as shown in FIG. 3B.

Subsequently, as shown in FIG. 3A/B, a polarization enhanced tunnel junction 12 is formed on the second surface 117 and/or 117' of the pits 116 in a manner that the tunnel junction 12 is parallel to the second surface 117 and/or 117'. In one embodiment, the tunnel junction 12 includes a super-lattice structure (not shown), which includes at least two sub-layers of distinct materials that are stacked alternately. In one embodiment, each sub-layer has a thickness less than or equal to 5 nm, and the thickness of the entire super-lattice structure is less than or equal to 10 nm. The super-lattice structure of the embodiment may include a material of group III nitride, that is, one, two, or three elements of group III in company with nitride, resulting in a binary compound, a ternary compound, or a quaternary compound. The super-lattice structure may be formed by alternating two of the aforementioned compounds. For example, the super-lattice structure may be formed by alternating two binary compounds, the binary compound and the ternary compound, the binary compound and the quaternary compound, two ternary compounds, the ternary compound and the quaternary compound, or two quaternary compounds, where the binary compound may include indium nitride (InN), gallium nitride (GaN) or aluminum nitride (AlN); the ternary compound may include indium gallium nitride ($In_xGa_{1-x}N$), indium aluminum nitride ($In_xAl_{1-x}N$), or aluminum gallium nitride ($Al_xGa_{1-x}N$); and the quaternary compound may include indium aluminum gallium nitride ($In_xAl_yGa_{1-x-y}N$). In the embodiment, the amount of polarization in the tunnel junction 12 may be controlled by adjusting a concentration of indium (In), say, indium in indium nitride (InN). For example, the polarization in the tunnel junction 12 may be enhanced by increasing the concentration of indium.

In another embodiment, the tunnel junction 12 may include a three-layer structure (not shown), which includes two doped layers and an insulating layer interposed between the two doped layers. Specifically, one of the two doped layers has conductivity opposite to conductivity of the other doped layer (e.g., one doped layer is n-doped and the other doped layer is p-doped), and the insulating layer may include aluminum nitride (AlN) or silicon nitride ($SiN_x$).

The polarization effect generated by the polarization enhanced tunnel junction 12 primarily comes from spontaneous polarization effect and piezoelectric polarization effect. The spontaneous polarization effect is largely due to intrinsic asymmetry in a crystal structure. Specifically, as nitride crystals grow along lattice direction [0001] of a Wurtzite structure, charge centers of positive and negative unit cells are not coincided, resulting in a dipole moment, which has a polarization direction only related to an epitaxial layer but not influenced by external electric field. The piezoelectric polarization effect is largely due to stress generated by lattice mismatch while forming films, and charges between films are strained and accumulated at junctions because of lattice deformation. Accordingly, the piezoelectric polarization effect exerts influence on polarization and stress along polarization direction.

When the tunnel junction 12 adopts the super-lattice structure or aluminum nitride (AlN) as the insulating layer in the three-layer structure, the spontaneous polarization effect and the piezoelectric polarization effect may be caused by distinct nitride compounds that are alternately stacked in the super-lattice structure or AlN in the three-layer structure, therefore enhancing the extent of polarization in the tunnel junction 12. When the tunnel junction 12 adopts silicon nitride ($SiN_x$) as the insulating layer in the three-layer structure, stress caused by the silicon nitride may enhance the piezoelectric polarization effect, therefore enhancing the extent of polarization in the tunnel junction 12.

As shown in FIG. 1B, a second semiconductor unit 13 is formed above the tunnel junction 12. In one embodiment, the second semiconductor unit 13 is formed along a polar plane or a semi-polar plane such that a surface of the second semiconductor unit 13 is a polar plane or a semi-polar plane. The stacked first semiconductor unit 11 and the second semiconductor unit 13 may, but not necessarily, be used as an LED or a photovoltaic cell. The second semiconductor unit 13 may, but not necessarily, include a material of group III nitride. In the embodiment, the second semiconductor unit 13 includes a first doped layer 131, an active layer 132, and a second doped layer 133. The first doped layer 131 has conductivity opposite to conductivity of the second doped layer 133. For example, the first doped layer 131 is n-doped and the second doped layer 133 is p-doped, and the active layer 132 is interposed between the first doped layer 131 and the second doped layer 133. As shown in FIG. 1B, the first doped layer 131 of the second semiconductor unit 13 fills up the pits 116. Although one tunnel junction 12 is exemplified in the embodiment discussed above to stack two semiconductor units 11 and 13, two or more tunnel junctions may be utilized to three or more semiconductor units.

In the embodiment, the greater the ratio of slant surface of the pits 116 to the first surface 114, the more easily the second semiconductor unit 13 can grow. In other words, the higher the density of the pits 116 or the smaller the size of the pits 116, the more easily the second semiconductor unit 13 can grow. In another embodiment, as shown in FIG. 1C, a buffer layer 14 is further formed above the tunnel junction 12, before the second semiconductor unit 13 is formed, and the buffer layer 14 fills up the pits 116. Accordingly, the second semiconductor unit 13 may be formed on a flat buffer layer 14, facilitating the growth of the second semiconductor unit 13.

Figure 4A:
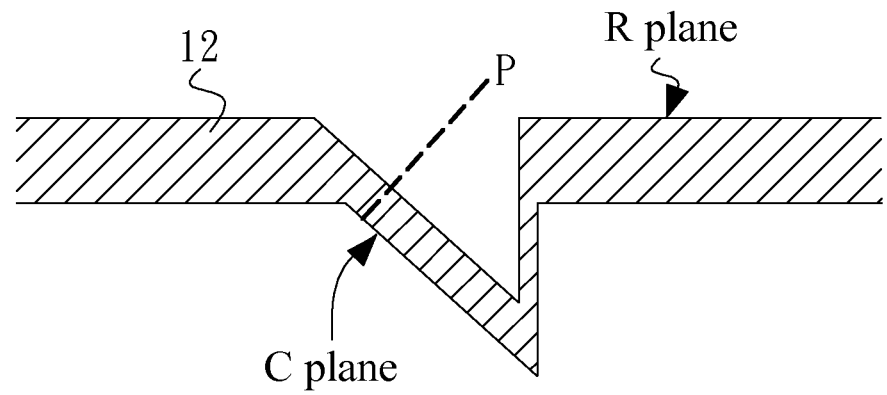
FIG. 4A shows a partial enlarged view of a pit with an R-plane first surface and a C-plane second surface.

As described above, the carriers in the semiconductor device 100 may be effectively transferred with a properly chosen pair of the first surface 114 and the second surface 117. FIG. 4A shows a partial enlarged view of a pit 116 with an R-plane first surface 114 and a C-plane second surface 117. In the example, the tunnel junction 12 may include a super-lattice structure or a three-layer structure. As polarization direction (indicated by P) is perpendicular to a C plane, carriers may tunnel along the polarization direction P, facilitating current distribution of the first semiconductor unit 11 (at bottom) and the second semiconductor unit 13 (at top).

Figure 4B:
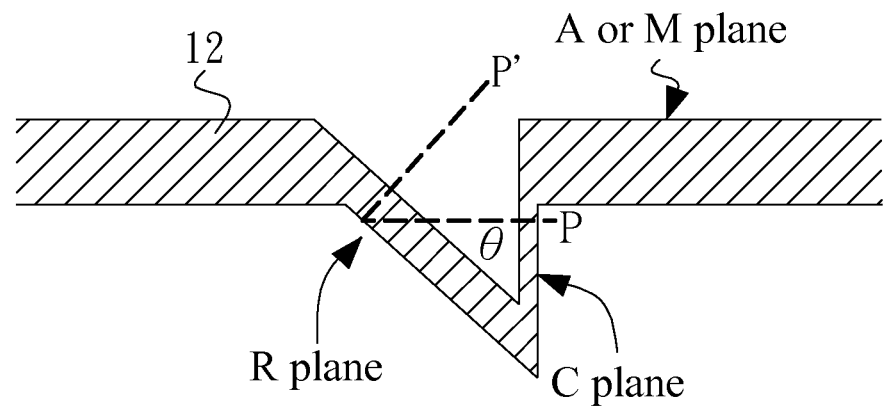
FIG. 4B shows a partial enlarged view of a pit with an A-plane or M-plane first surface, and an R-plane second surface or a C-plane second surface.

FIG. 4B shows a partial enlarged view of a pit 116 with an A-plane or M-plane first surface 114, an R-plane second surface 117 that is inclined relative to the first surface 114, and a C-plane second surface 117' that is perpendicular to the first surface 114.

In the example, the tunnel junction 12 (e.g., indium gallium nitride) may include a super-lattice structure. As there is an angle (57.6° as shown in FIG. 2) between the C plane and the R plane, polarization along the polarization direction P' is equal to the projected amount (P'=P*cos) of the polarization along C-plane polarization direction P, such that polarization along the polarization direction P' is smaller than polarization along the polarization direction P. Carriers may tunnel along the polarization P' due to the R plane (i.e., the second surface 117) in the pits 116, or carriers may further tunnel along the polarization direction P due to the C plane (i.e., the second surface 117'), facilitating carrier transfer from the first semiconductor unit 11 (at bottom) to the second semiconductor unit 13 (at top). The polarization in the tunnel junction 12 may be enhanced by increasing the concentration of indium, such that carriers tunneling along the polarization direction P' is much easier.

Although specific embodiments have been illustrated and described, it will be appreciated by those skilled in the art that various modifications may be made without departing from the scope of the present invention, which is intended to be limited solely by the appended claims.

What is claimed is:

1. A method of manufacturing a stacked semiconductor device, comprising;
   providing a first semiconductor unit having a first surface that is not a polar plane;
   forming at least one pit from the first surface, the pit having a second surface that lies at an angle relative to the first surface;
   forming a polarization enhanced tunnel junction on the second surface; and
   forming a second semiconductor unit above the tunnel junction, whereby the at least one pit enhances the polarization of the tunnel junction.

2. The method of claim 1, wherein the first surface is a non-polar plane or a semi-polar plane.

3. The method of claim 1, wherein the second surface is a polar plane or a semi-polar plane.

4. The method of claim 1, wherein the pit is formed by controlling a process temperature or a growth rate.

5. The method of claim 4, wherein the pit is formed at the process temperature in a range of 500-900° C.

6. The method of claim 4, wherein the pit is formed at the growth rate in a range of 1-6 m/h.

7. The method of claim 1, wherein the pit is formed by photolithography and etching techniques.

8. The method of claim 1, wherein the tunnel junction comprises an indium compound, and the method further increases a concentration of indium to enhance polarization in the tunnel junction.

9. The method of claim 1, wherein the second semiconductor unit is formed along the normal of a polar plane or a semi-polar plane.

10. A stacked semiconductor device, comprising;
    a first semiconductor unit having a first surface that is not a polar plane;
    a second semiconductor unit formed above the first semiconductor unit;
    at least one pit formed from the first surface, the pit having a second surface that lies at an angle relative to the first surface;
    and a polarization enhanced tunnel junction formed on the second surface and in between the first semiconductor unit and the second semiconductor unit, whereby the at least one pit enhances the polarization of the tunnel junction.

11. The device of claim 10, wherein the first or the second semiconductor unit comprises a first doped layer, an active layer and a second doped layer, the first doped layer having conductivity opposite to conductivity of the second doped layer, and the active layer being interposed between the first doped layer and the second doped layer.

12. The device of claim 10, wherein the first or the second semiconductor unit comprises group III nitride.

13. The device of claim 10, wherein the first surface is a non-polar plane or a semi-polar plane.

14. The device of claim 10, wherein the second surface is a polar plane or a semi-polar plane.

15. The device of claim 10, wherein the first surface is an M plane and the second surface is a C plane or an R plane.

16. The device of claim 10, wherein the first surface is an A plane and the second surface is an R plane or a C plane.

17. The device of claim 10, wherein the first surface is an R plane and the second surface is a C plane.

18. The device of claim 10, wherein the pit has a depth less than or equal to 2 m, and larger than 10 nm.

19. The device of claim 10, wherein the tunnel junction is formed on the first surface.

20. The device of claim 10, wherein the tunnel junction comprises a super-lattice structure.

21. The device of claim 20, wherein the super-lattice structure comprises at least two sub-layers of distinct materials that are stacked alternately.

22. The device of claim 21, wherein each said sub-layer has a thickness less than or equal to 5 nm, and a thickness of the super-lattice structure is less than or equal to 10 nm.

23. The device of claim 21, wherein the super-lattice structure comprises group III nitride, and each said sub-layer comprises one, two or three elements of group III in accompanied with nitride, resulting in a binary compound, a ternary compound or a quaternary compound.

24. The device of claim 23, wherein the binary compound comprises indium nitride (InN), gallium nitride (GaN) or aluminum nitride (AlN); the ternary compound comprises indium gallium nitride ($In_xGa_{1-x}N$), indium aluminum nitride ($In_xAl_{1-x}N$), or aluminum gallium nitride ($Al_xGa_{1-x}N$); and the quaternary compound comprises indium aluminum gallium nitride ($In_xAl_yGa_{1-x-y}N$).

25. The device of claim 10, wherein the tunnel junction comprises a three-layer structure that includes two doped layers and an insulating layer interposed between the two doped layers, one of the two doped layers having conductivity opposite to conductivity of the other doped layer, and the insulating layer including aluminum nitride (AlN) or silicon nitride ($SiN_x$).

26. The device of claim 10, further comprising a buffer layer formed above the tunnel junction and filling up the pit.

27. The device of claim 10, wherein the second semiconductor unit has a surface that is a polar plane or a semi-polar plane.

* * * * *